United States Patent
Maloney

(10) Patent No.: US 6,177,200 B1
(45) Date of Patent: Jan. 23, 2001

(54) THERMAL BARRIER COATING SYSTEMS AND MATERIALS

(75) Inventor: Michael J. Maloney, Port St. Lucie, FL (US)

(73) Assignee: United Technologies Corporation, Hartford, CT (US)

(*) Notice: Under 35 U.S.C. 154(b), the term of this patent shall be extended for 0 days.

(21) Appl. No.: 09/164,700

(22) Filed: Oct. 1, 1998

Related U.S. Application Data

(63) Continuation-in-part of application No. 08/764,419, filed on Dec. 12, 1996, now Pat. No. 6,117,560.

(51) Int. Cl.$^7$ .................................................. B32B 9/00
(52) U.S. Cl. ........................ 428/472; 428/469; 428/697; 428/699; 428/701; 428/702
(58) Field of Search .................................. 428/472, 469, 428/697, 699, 701, 702

(56) References Cited

U.S. PATENT DOCUMENTS

| | | | |
|---|---|---|---|
| 3,718,499 | 2/1973 | Kanter | 117/127 |
| 4,321,310 | 3/1982 | Ulion et al. | 428/612 |
| 4,321,311 | 3/1982 | Strangman | 428/623 |
| 4,639,399 | 1/1987 | Aprigliano | 428/623 |
| 4,996,117 | 2/1991 | Chu et al. | 428/633 |
| 5,304,519 | * 4/1994 | Jackson et al. | 510/103 |
| 5,495,979 | 3/1996 | Sastri et al. | 228/124.1 |
| 5,512,382 | 4/1996 | Strangman | 428/632 |
| 5,562,998 | 10/1996 | Strangman | 428/612 |
| 5,652,044 | 7/1997 | Rickerby | 428/216 |
| 5,716,720 | 2/1998 | Murphy | 428/623 |
| 5,722,379 | 3/1998 | Binder et al. | 123/668 |
| 5,763,107 | 6/1998 | Rickerby et al. | 428/623 |

FOREIGN PATENT DOCUMENTS 0 825 271 A1   2/1998   (EP) .............................. C23C/04/04

OTHER PUBLICATIONS

M.A. Subramanian, G. Aravamudan and G. V. Subba Rao, "Oxide Pyrochlores—A Review".
Harry L. Tuller and Peter K. Moon, "Fast Ion Conductors: Future Trends".
M. J. Maloney, "High Efficiency Thermal Barrier Coatings for Advanced Alloy Airfoils", Mar. 15, 1996.
Robert S. Roth, "Pyrochlore–Type Compounds Containing Double Oxides of Trivalent and Tetravalent Ions", vol. 56, No. 1, Jan. 1956, Journal of Research of the National Bureau of Standards, pp. 17–25.
M. Kakihana, M.M. Milanova, M. Arima, T.Okubo, M. Yashima and M. Yoshimura, "Polymerized Complex Route to Synthesis of Pure $Y_2Ti_2O_7$ at 750° C Using Yttrium–Titanium Mixed–Metal Citric Acid Complex", pp. 1673–1676.
Periodic Table of The Elements.
Patent Disclosure by M.J. Maloney, "Rare Earth Pyrochlore Zirconate Base Thermal Barrier Coatings" Fig. 5232.
Two Oxides, Figs 2373–2376 p. 103.
P. 341 Fd3mO7h.
Two Oxides, Figs. 6469–6470 p. 165.
Ronald A. McCauley, "Structural Characteristics of Pyrochlore Formation", pp. 290–294.
Two Oxides, Figs. 4376–4377 pp. 135–136.
Ernest M. Levin and Howard F. McMurdie, "Phase Diagrams for Ceramists 1975 Supplement", 3 pgs.

\* cited by examiner

*Primary Examiner*—Archene Turner
(74) *Attorney, Agent, or Firm*—F. Tyler Morrison, III

(57) ABSTRACT

A ceramic material has particular utility as a thermal insulating or thermal barrier coating on metallic substrates. The ceramic material includes gadolinia and zirconia, preferably forming gadolinia-zirconia oxide. The material may include fluorite and pyrochlore structure. This material exhibits chemical stability, thermal stability and thermal insulating properties superior to those of currently used thermal barrier ceramics, and also provides resistance to sintering and erosion comparable to currently used ceramics. A preferred material has between about 5–60 mol. % gadolinia.

22 Claims, 12 Drawing Sheets

○ Zr
○ La
○ O

○ Zr
○ O

FIG.3A
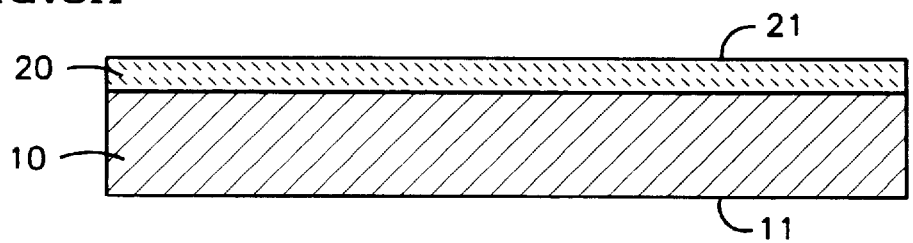
FIG.3B
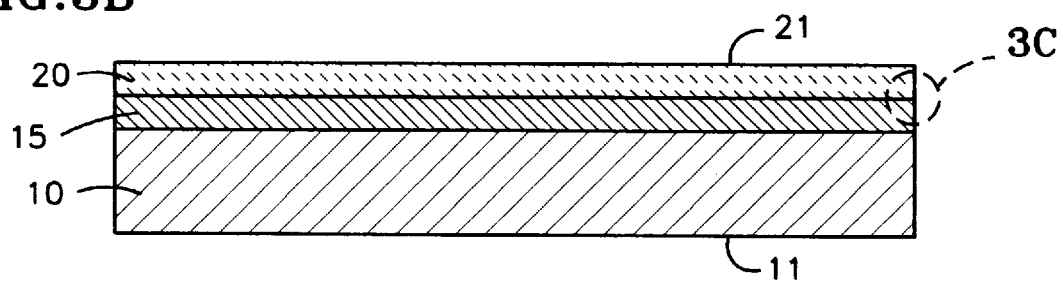
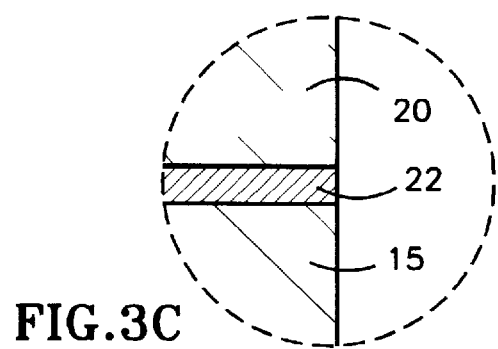
FIG.3C

La$_2$O$_3$-ZrO$_2$

THERMAL BARRIER COATING SYSTEMS AND MATERIALS

This application is a continuation-in-part of application Ser. No. 08/764,419 entitled "Thermal Barrier Coating Systems and Materials" filed on Dec. 12, 1996, now U.S. Pat. No. 6,117,560.

FIELD OF THE INVENTION

This invention relates to ceramic materials for thermal barrier coatings, to thermal barrier coatings made of such materials, and to metallic parts having such thermal barrier coatings. The thermal barrier coatings have particular utility in gas turbine engines. The preferred ceramic material is preferably composed of gadolinia and zirconia and has a cubic crystal structure.

BACKGROUND OF THE INVENTION

Gas turbine engines are well developed mechanisms for converting chemical potential energy, in the form of fuel, to thermal energy and then to mechanical energy for use in propelling aircraft, generating electric power, pumping fluids etc. At this time, the major available avenue for improved efficiency of gas turbine engines appears to be the use of higher operating temperatures. However, the metallic materials used in gas turbine engines are currently very near the upper limits of their thermal stability. In the hottest portion of modern gas turbine engines, metallic materials are used at gas temperatures above their melting points. They survive because they are air cooled. But providing air cooling reduces engine efficiency.

Accordingly, there has been extensive development of thermal barrier coatings for use with cooled gas turbine aircraft hardware. By using a thermal barrier coating, the amount of cooling air required can be substantially reduced, thus providing a corresponding increase in efficiency.

Such coatings are invariably based on ceramic. Mullite, alumina, etc. have been proposed, but zirconia is the current material of choice. Zirconia must be modified with a stabilizer to prevent the formation of the monoclinic phase, and typical stabilizers include yttria, calcia, ceria and magnesia. prevent the formation of the monoclinic phase, and typical stabilizers include yttria, calcia, ceria and magnesia.

Generally speaking, metallic materials have coefficients of thermal expansion which exceed those of ceramic materials. Consequently, one of the problems that must be addressed in the development of successful thermal barrier coatings is to match the coefficient of thermal expansion of the ceramic material to the metallic substrate so that upon heating, when the substrate expands, the ceramic coating material does not crack. Zirconia has a high coefficient of thermal expansion and this is a primary reason for the success of zirconia as a thermal barrier material on metallic substrates.

Thermal barrier coatings have been deposited by several techniques including thermal spraying (plasma, flame and HVOF), sputtering and electron beam physical vapor deposition (EBPVD). Of these techniques, electron beam physical vapor deposition is currently a preferred technique for demanding applications because it produces a unique coating structure. Electron beam physical vapor deposited ceramic materials, when applied according to certain parameters, have a columnar grain microstructure consisting of small columns separated by gaps which extend into the coating. These gaps allow substantial substrate expansion without coating cracking and/or spalling. See, e.g., commonly owned U.S. Pat. No. 4,321,311. According to U.S. Pat. No. 5,073,433 and commonly-owned U.S. Pat. No. 5,705,231, a similar structure (comprising segmentation cracks) although on a larger scale, can be obtained by plasma spray techniques.

Despite the success with the current use of electron beam physical vapor deposited zirconia base coatings, there is a continuing desire for improved coatings which exhibit superior thermal insulation capabilities, especially those improved in insulation capabilities when normalized for coating density. Weight is always a critical factor when designing gas turbine engines, particularly rotating parts. Ceramic thermal barrier coatings are not load supporting materials, and consequently they add weight without increasing strength. There is a strong desire for a ceramic thermal barrier material which adds the minimum weight while providing the maximum thermal insulation capability. In addition, there are obviously the normal desires for long life, stability, economy etc.

Although this coating was developed for application in gas turbine engines, the invention clearly has utility in other applications where high temperatures are encountered, such as furnaces and internal combustion engines.

DESCRIPTION OF THE DRAWINGS

FIG. 3A depicts a ceramic coating directly on a metallic substrate.

FIG. 3B depicts a ceramic coating on a metallic substrate with an intermediate bond coat.

FIG. 3C depicts an expanded view of the interface between the bond coat and the ceramic layer in FIG. 3B.

SUMMARY OF THE INVENTION

Figure 1A:
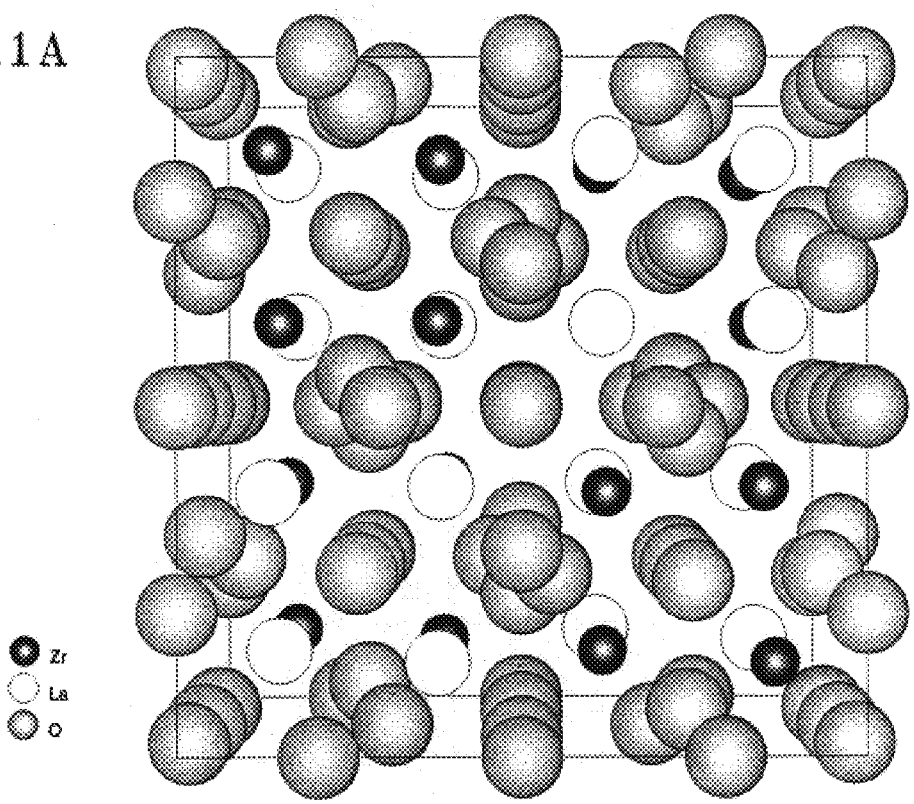
FIG. 1A depicts the crystal structure of a pyrochlore, such as lanthanum zirconate or gadolinia zirconate.

The essence of the present invention arises from the discovery that a class of ceramic materials has great utility as thermal barrier coatings on metallic substrates. While some of these materials may include a pyrochlore crystal structure, recent testing has demonstrated that others of these materials, such as gadolinia-zirconia oxide (generally denoted $(Gd,Z_r)O_2$) including a cubic, non-pyrochlore crystal structure are also useful as thermal barrier coatings.

The term pyrochlore is used to identify an ore of tantalum found in Canada. The term more generally describes a ceramic structure of the composition $A_2 B_2 O_7$ where A can have valance of $3^+$ or $2^+$ and B can have a valance of $4^+$ or $5+$ and wherein the sum of the A and B valences is 7. The oxygen can be replaced in part by sulfur or fluorine. Typical pyrochlores which we believe to have potential as thermal barrier coatings are those in which A is selected from the group consisting of lanthanum, gadolinium and yttrium and mixtures thereof and B is selected from the group consisting of zirconium, hafnium and titanium and mixtures thereof. Many other pyrochlores exist which also have potential as thermal barrier materials. See "Oxide Pyrochlores—A Review" by M. A. Subramanian et al, *Progress in Solid State Chemistry*, vol. 15, pp. 55–143, 1983 (incorporated herein by reference) for a full description of pyrochlores.

We have found that, on a density adjusted basis, pyrochlores which we have investigated have thermal insulating properties which exceed those of the more commonly used zirconia-based thermal barrier materials. Additionally, many of the pyrochlore materials have a phase relationship in which the pyrochlore structure is phase stable up to the melting point. Most of the pyrochlores which we have investigated have melting points of more than 3000° F. (1650 ° C.) and generally more than 4000° F. (2200° C.). Some of the materials having a cubic and at least generally non-pyrochlore crystal structure, e.g., gadolinia-zirconia oxide $(Gd,Zr)O_2$ are also phase stable up to at least about 3000° F. (1650° C.), and in the case of gadolinia zirconia oxide (FIG. 12), any transformation of pyrochloric gadolinia zirconate structure tends to be to the conventional cubic structure, which is also quite phase stable. Additionally, all of these materials adhere to alumina. These properties are all useful in thermal barrier coatings.

The invention coating materials and coatings will usually be used to protect a superalloy substrate from excess temperatures. Superalloys are metals, usually based on iron, nickel or cobalt and containing chromium and aluminum and usually including titanium and refractory metals, and having useful properties above 1200° F. (650° C.). Other substrates, including steels, copper alloys and titanium alloys may be protected. Table I describes exemplary substrate materials.

It is known from prior zirconia thermal barrier coatings that a metallic bond coat (sometimes described as an overlay coating) such as a MCrAlY is a superior bond coat for ceramic coatings. It is also known that aluminide coatings are useful bond coats, though generally not as durable as MCrAlY bond coats. The common feature of overlay coatings and aluminide coatings is that they both form adherent alumina surface films or scales.

A broad composition range for MCrAlY materials is 10–25% Cr, 5–15 Al, 0.1–1.0 Y balance selected from Fe, Ni, and Co and mixtures of Ni and Co. Additions of up to 5% each of Hf, Ta or Re, up to 1% of Si and up to 3% each of Os, Pt, Pd, or Rh may also be made. Table II describes exemplary MCrAlYs that can be applied by thermal spray processes, by EBPVD processes, and by electroplating.

TABLE II

| (wt % - Exemplary MCrAlY Compositions) | | | | | | |
|---|---|---|---|---|---|---|
| | Ni | Co | Cr | Al | Y | Hf | Si |
| NiCrAlY | Bal | — | 19.5 | 12.5 | .45 | — | — |
| CoCrAlY | — | Bal | 18 | 11 | .45 | — | — |
| NiCoCrAlY | Bal | 23 | 18 | 12.5 | .3 | — | — |
| NiCoCrAlY | Bal | 22 | 17 | 12.5 | .6 | .25 | .4 |

An alternate bond coat is a diffusion aluminide formed by diffusing aluminum into the substrate surface. Diffusion aluminides are well known and may be applied using a mixture (termed a pack) containing an aluminum source, such as an aluminum alloy or compound, an activator (usually a halide compound such as NaF) and an inert material such as alumina. The part 15 to be coated is buried in the pack and heated to 1500–2000° F. while a carrier gas, such as hydrogen, is flowed through the pack. Out of pack processes, during which the part is not buried in the pack, are also known. The incorporation of precious metals such as Pt, Rh, Pd and Os into aluminide coatings is known. See, e.g., U.S. Pat. No. 5,514,482 for a description of aluminide coating processes.

Combinations of overlay and aluminide coatings are also possible. See, commonly owned U.S. Pat. No. 4,897,315 for a description of a system having an inner MCrAlY overlay coating and an outer aluminide coating. See, commonly owned U.S. Pat. No. 4,005,989 for a description of the reverse combination, an inner aluminide coating and an outer overlay coating.

The common feature of these bond coats and bond coat combinations is that they form an adherent layer of alumina on their outer surface. The invention thermal barrier coating has limited solubility in alumina, but bonds firmly to the alumina.

TABLE I

| (wt % - Exemplary Superalloy Compositions) | | | | | | | | | | | | | |
|---|---|---|---|---|---|---|---|---|---|---|---|---|---|
| | Cr | Co | W | Cb | Ti | Al | B | Hf | C | Ni | Ta | Mo | Zr | Re |
| PWA1422 | 9 | 10 | 12 | 1 | 2 | 5 | 0.015 | 1.6 | .14 | Bal | — | — | — | — |
| PWA1426 | 6.4 | 12.6 | 6.4 | — | — | 5.9 | 0.012 | 1.5 | — | Bal | 3.0 | 1.7 | .08 | .3 |
| PWA1480 | 10 | 5 | 4 | — | 1.5 | 5 | — | — | — | Bal | 12 | — | — | — |
| PWA1484 | 5 | 10 | 5.9 | — | — | 5.6 | — | 0.1 | — | Bal | 8.7 | 1.9 | — | 3.0 |
| PWA1487 | 5 | 10 | 5.9 | — | — | 5.6 | — | .35 | — | Bal | 8.4 | 1.9 | — | 3.0 |
| IN 792 | 12 | 9 | 3.8 | — | 4.1 | 3.5 | 0.015 | 0.5 | .12 | Bal | 3.9 | 1.9 | .12 | — |

As in other ceramic thermal barrier coatings, adherence of the ceramic to the alloy substrate is critical, whether the ceramic has a non-pyrochlore (e.g., fluorite) and/or pyrochlore-containing crystal structure.

In certain cases, superalloys may form sufficiently perfect and adherent alumina layers to which the ceramics may adhere without a separate bond coat. See, commonly owned U.S. Pat. Nos. 4,209,348, 4,719,080, 4,895,201, 5,034,284, 5,262,245 and 5,346,563; see also 5,538,796.

To date all successful applications of ceramic coatings to superalloy have included an oxide layer (usually alumina, rarely silica) between the bond coat (or substrate) and the ceramic coating.

DESCRIPTION OF THE PREFERRED EMBODIMENTS

The pyrochlore structure is a complex structure which can be described in a variety of ways, as a fluorite structure derivative, or as a network of octahedral linked corner to corner with cations filling the interstices.

The gadolinia-zirconia oxide in accordance with the present invention is discussed further below with reference to FIG. 8, and includes a cubic (e.g., fluorite) and typically non-pyrochlore crystal structure.

Figure 1B:
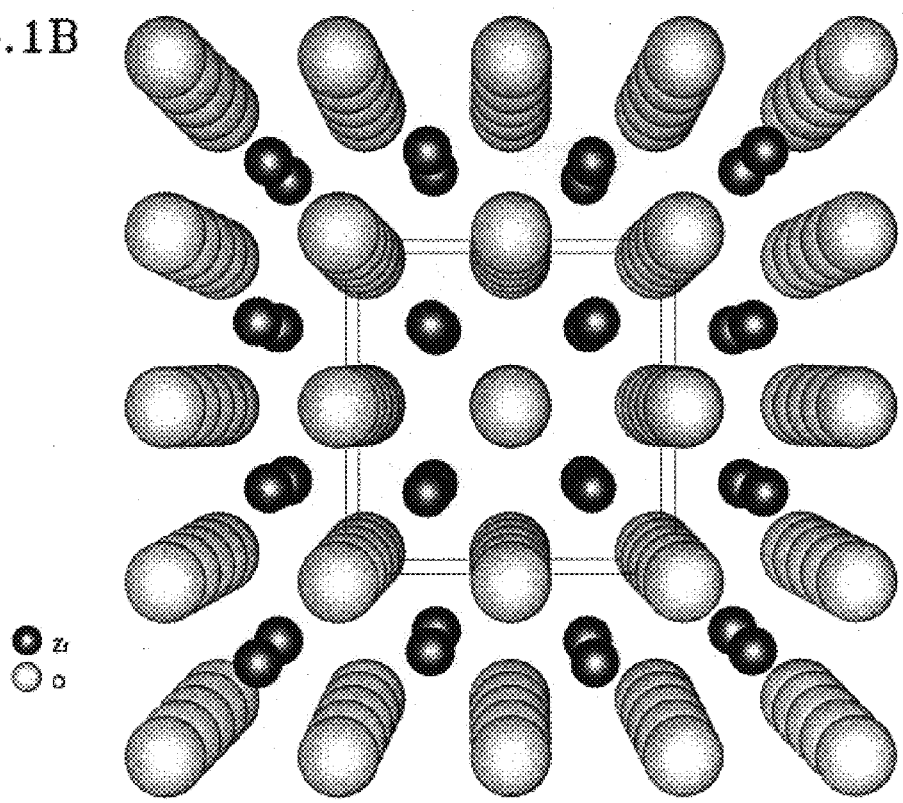
FIG. 1B depicts the crystal structure of a fluorite structure, such as fully stabilized zirconia.

FIG. 1A is a depiction of a cubic pyrochlore crystal structure. Regardless of structure description the pyrochlore structure has a chemical composition of $A_2$ $B_2$ $O_7$ or occasionally $A_2$ $B_2$ $O_6$ or $AB_2$ $O_6$, with the latter two being referred to as defect pyrochlores. FIG. 1A illustrates lanthanum zirconate having an $A_2B_2O_7$ chemistry and the pyrochlore crystal structure. FIG. 1B shows a cubic fluorite structure (i.e., non-pyrochlore), the structure of fully stabilized zirconia, and as described further below illustrates the structure of gadolinia zirconia oxide with a fluorite structure. A comparison of FIGS. 1A and 1B shows both similarities and differences between the two structures. Both FIGS. 1A and 1B are views down the <100> crystal axis. Visually, the pyrochlore structure appears to be less regular than the fluorite structure.

Figure 2:
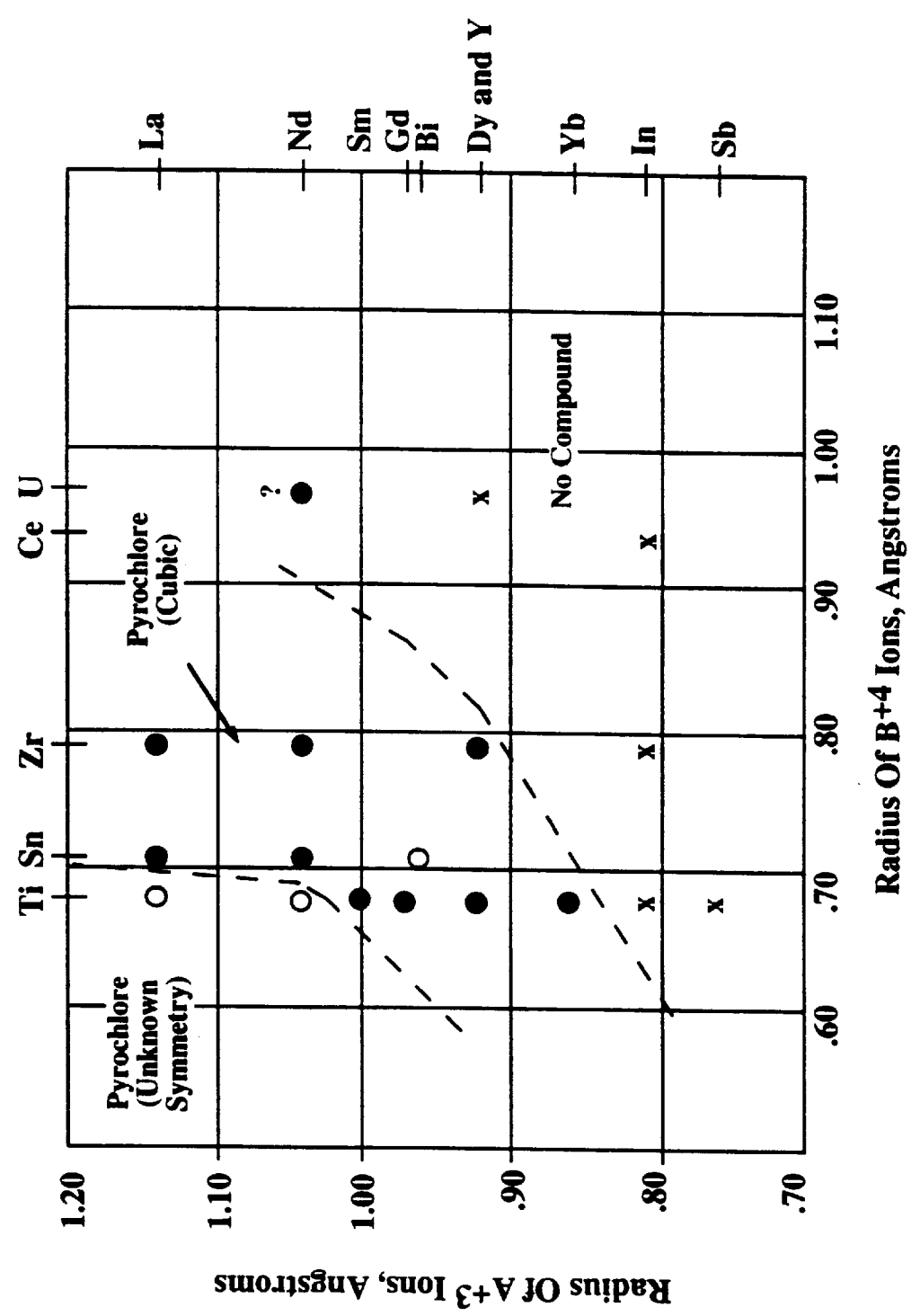
FIG. 2 shows the relationship between the A and B constituent ionic sizes necessary to produce a pyrochlore structure.

For pyrochlores, the A and B ions can have different valances as long as the sum of the A and B valences adds up to 7, in the case of the $A_2B_2O_7$ or 6 in the case of $A_2B_2O_6$ structures. While the pyrochlore compounds described herein all have either $A_2B_2O_7$ or $A_2B_2O_6$ structures, all compounds having $A_2B_2O_7$ or $A_2B_2O_6$ structures (including the gadolinia zirconia oxide described below) are not necessarily pyrochlores. The pyrochlore structure forms only for certain relationships of A and B ionic radii. FIG. 2 illustrates this relationship indicating the general combination of A and B ionic radii which produce cubic pyrochlores. We have found that the boundaries of this diagram are somewhat uncertain and we believe, based on our investigations, that lanthanum titanate [$La_2$ $Ti_2$ $O_7$] has a stable, cubic pyrochlore structure. Noncubic pyrochlores are known but for the purpose of the first aspect (the pyrochlores) of this invention we prefer to use ceramics which have a cubic pyrochlore structure.

As shown in FIG. 2, the formation of the desired cubic pyrochlore crystal structure is controlled by the relative ionic radii of the A and B constituents. It is possible to use a mixture of elements for the A and/or B constituents to provide an average ionic radius which will cause formation of a cubic pyrochlore structure. By way of example, from FIG. 2 it can be seen that both $Gd_2Ti_2O_7$ and $Y_2Zr_2O_7$ will have cubic pyrochlore structures. As a general rule, compounds of the formula $(Gd_xY_y)(Ti_aZr_b)O_7$, where x+y=2 and a+b=2, will also have a cubic pyrochlore structure. Further, a compound which is not cubic, such as $Ln_2Zr_2O_7$, could likely be rendered cubic through partial substitution to bring the average A and B ionic radii into the cubic pyrochlore region shown in FIG. 2, such as by Nd for Ln and/or Ti for Zr.

Gadolinia zirconia oxide is a weak pyrochlore former (the area P bounded by dashed lines in FIG. 12), as indicated by the fact that the ionic radii of gadolinia and zirconia are relatively large, near the edge of pyrochlore forming region of FIG. 2. Recent testing has indicated that gadolinia and zirconia prepared in a composition and temperature expected to form pyrochlore structure actually exhibits either the fluorite structure or a combination of the fluorite structure and the pyrochlore structure.

We have worked with the type of pyrochlores denoted by the $A_2$ $B_2$ $O_7$ formula and of these we prefer to use gadolinium, lanthanum or yttrium for the A ionic species and hafnium, titanium or zirconium for the B ionic species. Lanthanum zirconate exhibits low thermal conductivity, but may be difficult to prepare by EB-PVD, since lanthanum and zirconium have substantially different vapor pressures, thus making vapor deposition more difficult. We have used only the materials of the $A_2$ $B_2$ $O_7$ structure and have not attempted the use of the known pyrochlores, which have either fluorine or sulfur to substitute a portion of the oxygen, but we do not believe that there is any reason to exclude the sulfur and fluorine-substituted compositions from the present invention. We have also not experimentally evaluated the $A_2B_2O_6$ and $AB_2O_6$ structures, but believe that they also may have utility in thermal barrier coatings. With respect to non-pyrochlore structures, gadolinia and zirconia have similar vapor pressures, thus making vapor deposition more readily possible.

Ti, Zr and Hf all display complete solid solubility in each other and we believe that any combination of Ti+Zr+Hf can be used as the B ionic species. Similarly, Gd, La and Y have substantial solid solubilities (Gd—La has complete solubility). Any combination of Gd+La+Y which does not form a second phase can be used as the A ionic species. These alloys of the A and B species must satisfy the criteria of FIG. 2 and possess a pyrochlore structure.

The low thermal conductivity of oxide pyrochlore compounds can be rationalized by consideration of crystallographic and chemical effects on thermal conductivity. The thermal conductivity of dielectric solids at elevated temperature is determined by phonon scattering, by crystal imperfections and other phonons. Oxide pyrochlore compounds exhibit many of the features associated with low thermal conductivity materials. The pyrochlore crystal structure has a high intrinsic defect concentration. It has been experimentally established that as the difference in atomic mass between constituents in a compound increases, the thermal conductivity of that compound tends to decrease. Although the pyrochlore and fluorite structure are closely related, substitution of a high concentration of relatively high atomic mass atoms (lanthanum, gadolinium and yttrium) into the fluorite structure provides a means to lower thermal conductivity that has not been known to readily exist with previously-used, stabilized zirconia compounds. It should be noted that, for thermal barrier applications, the benefits obtained from the reduction in thermal conductivity resulting from the use of high atomic mass elements must outweigh the debit incurred from higher density.

Reduction in thermal conductivity has also been associated with increasing complexity of crystallographic structure. As shown in FIG. 1A, the pyrochlore structure exhibits a greater degree of complexity than the fluorite structure shown in FIG. 1B. The cubic pyrochlore structure is similar to the cubic fluorite structure but with a large number of the oxygen atoms displaced (and one in eight missing).

Thermal barrier coatings are typically applied by thermal spray processes, such as plasma spray, in air (APS) or in low pressure (LPPS) by high velocity oxygen fuel processes (HVOF) or by detonation guns (D Gun). Electron beam physical vapor deposition (EBPVD) and sputtering are other techniques. Electron beam physical vapor deposition is a favored process. Depending upon the application and circumstances, each process has particular advantages. All of these processes can be readily used to apply oxide pyrochlore thermal barrier coatings, as well as non-pyrochlores such as gadolinia zirconia oxide. As previously discussed, the EBPVD process offers advantages, since it develops a structure suited for extreme temperature applications and is therefore be most suitable for coating hot section turbine components. Thermal spray processing offers advantages in coating large components of complex shape and would be most suitable in coating components such as combustors.

FIGS. 3A, 3B and 3C illustrate variants of the thermal barrier coatings in accordance with one aspect of the present invention. FIG. 3A depicts a coated article which comprises a superalloy substrate 10 having a pyrochlore top coat 20 on its outer surface 21. In gas turbine applications, the backside 11 of the superalloy substrate 10 will be cooled by cooling air (not shown) and the outside front surface 21 of the pyrochlore will be exposed to elevated temperatures. There may also be holes between the outer surface and the backside permitting cooling air to flow from the backside to the outer surface. Angled and shaped cooling holes in combination with flowing hot gases on the outer surface can produce film cooling in which a layer of cool air separates the outside surface from the hot gases to further reduce heat flow. Heat will flow from the front surface 21 to the cooled surface 11 and the quantity of the heat flow will be substantially reduced by the layer 20. As previously mentioned, the pyrochlore may be applied by various methods and the macrostructure of the pyrochlore layer will be largely a function of the deposition process. The most basic invention embodiment is a pyrochlore layer adhered to a substrate which reduces heat flow in the presence of a thermal gradient.

FIG. 3B illustrates a preferred construction which employs a bond coat 15 between the substrate 10 and the pyrochlore 20. The bond coat 15 improves adherence and provides oxidation protection for the substrate. FIG. 3C is an expanded view of the interlayer 16 between the bond coat 15 and the pyrochlore layer 20. An oxide layer 22, principally of alumina, exists at this interlayer and is believed to be principally responsible for the adherence of the pyrochlore.

It is known to augment the naturally occurring alumina layer on the bond coat by sputtering alumina onto the bond coat, in the case of zirconia thermal barrier coatings, and the use of a separately applied alumina layer (rather than a thermally grown oxide layer) is also an embodiment of this invention.

In a further embodiment another ceramic layer may be applied to the free surface of the thermal barrier coating. This added layer can be selected to reduce oxygen diffusion, to provide erosion and abrasion resistance, or to provide a desired thermal emissivity characteristic, or some combination of these characteristics.

Example I

Figure 4:
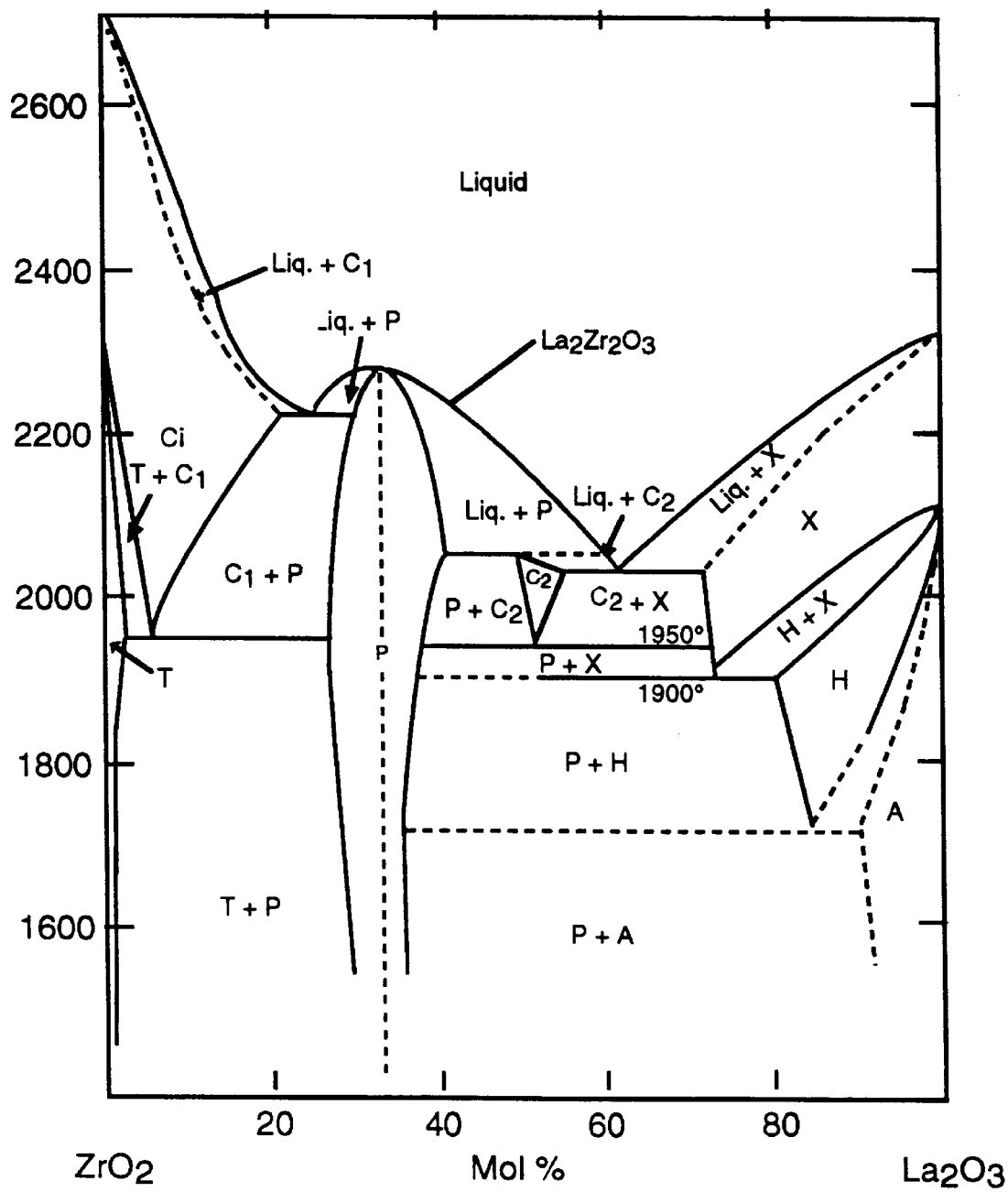
FIG. 4 shows the $ZrO_2$—$La_2O_3$ phase diagram.

The use of the $La_2Zr_2O_7$ (lanthanum zirconate) pyrochlore oxide compound as a EBPVD applied thermal barrier coating will be illustrated. The advantageous properties of the $La_2Zr_2O_7$ pyrochlore oxide relative to stabilized zirconia for thermal barrier coating include thermal conductivity, thermal expansion, density, phase stability, and lower cost relative to YSZ. FIG. 4 shows the $La_2O_3$—$ZrO_2$ phase diagram with the pyrochlore phase field labeled P. It can be seen that the pyrochlore structure (at about 35 mol % $La_2O_3$) is stable up to the melting point at about 2300° C. (4172° F.).

Figure 5:
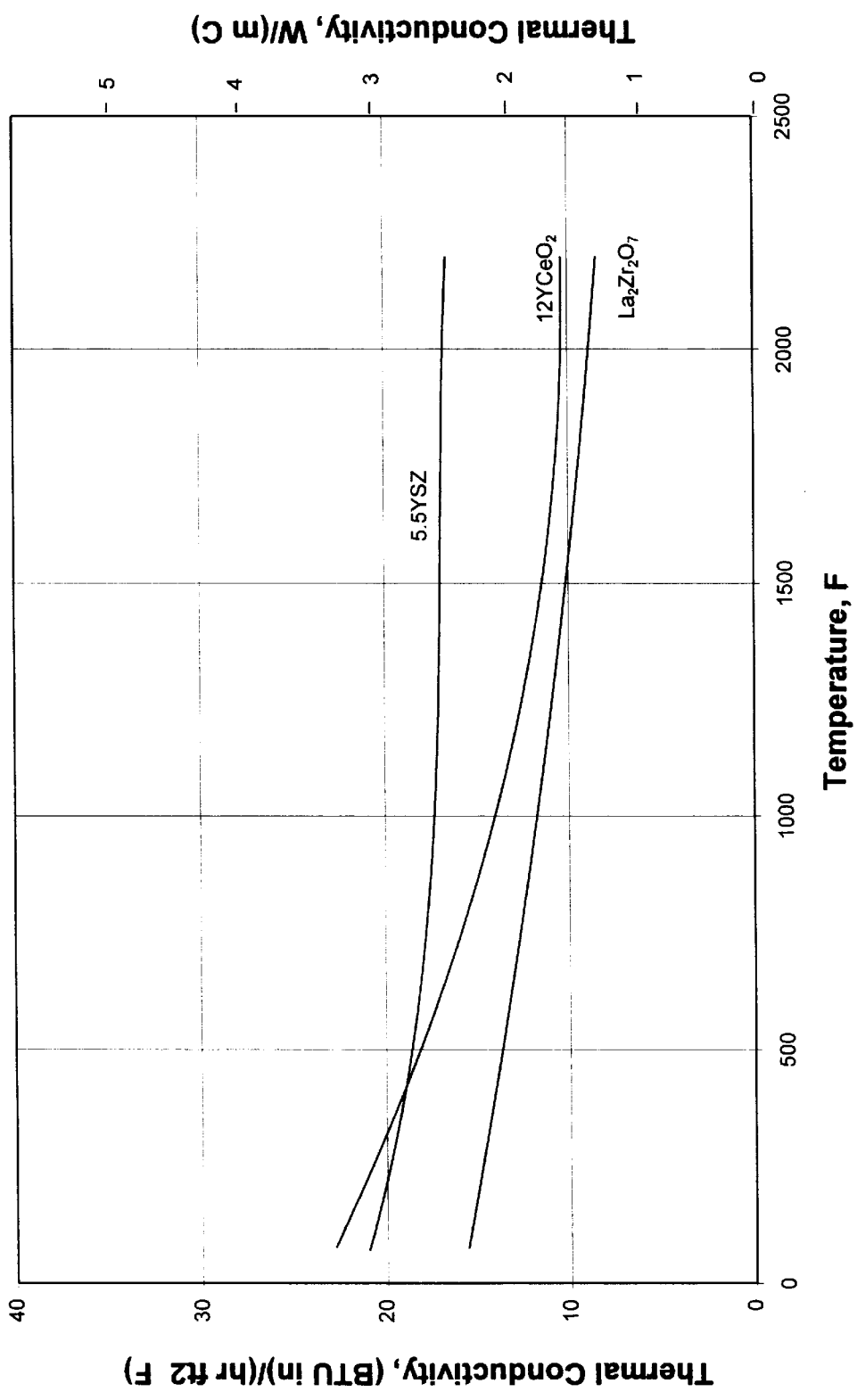
FIG. 5 shows the thermal conductivity of several ceramic materials.

FIG. 5 shows thermal conductivity of $La_2Zr_2O_7$ compared to the thermal conductivity of cubic zirconia as a function of temperature. At typical thermal barrier coating use temperatures, the pyrochlore compound exhibits a thermal conductivity which is about 50% that of stabilized zirconia. The density of the $La_2Zr_2O_7$ pyrochlore compound is approximately the same as stabilized zirconia (approximately 6 gr/cm$^3$) so on a weight corrected basis, the thermal conductivity benefit is also about 50%. Given the difference in vapor pressures of its constituents, $La_2Zr_2O_7$ would preferably be used as a plasma sprayed coating, To illustrate the benefit, the 50 percent reduction thermal conductivity allows the coating thickness to be reduced by 50 percent for the same degree of thermal protection. Decreasing the coating mass by 50 percent on a typical turbine blade will lower the blade pull at the blade root by approximately 1,500 pounds (680 Kg), at typical operating conditions, which results in a significant increase in blade life and permits a reduction in mass of the disk to which the blades are attached. If the thermal barrier coating were held at the same thickness, and the cooling air flow held constant, the substrate temperature would be reduced by about 100° F. (55° C.), giving increased substrate creep life. Keeping the coating thickness constant and reducing the airflow would increase engine efficiency. Combinations of these benefits, e.g., (slightly) reduced coating mass and (slightly) reduced cooling air, are also possible.

Figure 6:
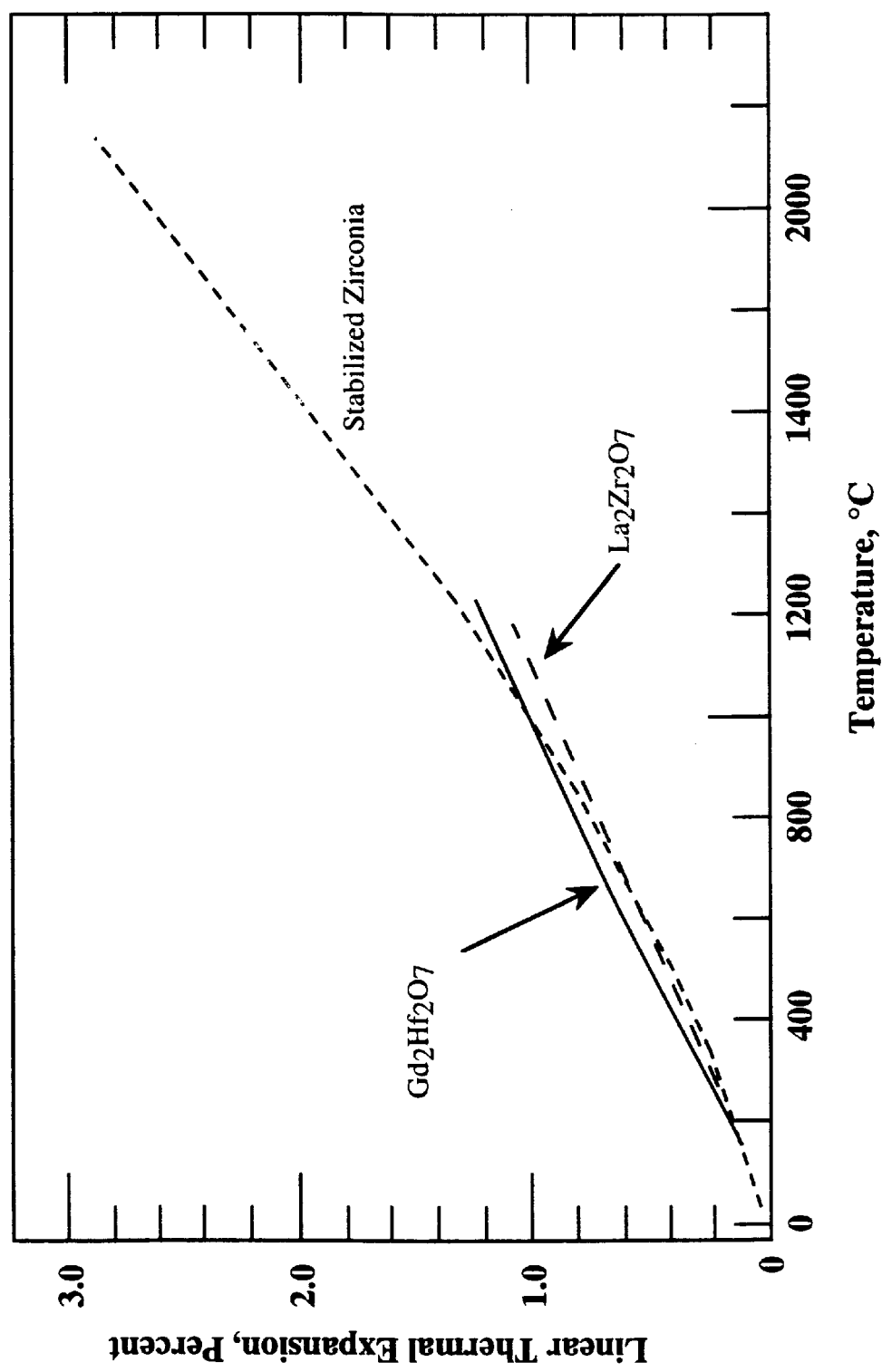
FIG. 6 shows the coefficient of thermal expansion for several ceramic materials.

FIG. 6 shows the mean coefficient of thermal expansion of $La_2Zr_2O_7$ compared to that of cubic stabilized zirconia as a function of temperature. The thermal expansion of $La_2Zr_2O_7$ thermal barrier coating can be seen to be similar to that of the cubic zirconia thermal barrier coating. This means that $La_2Zr_2O_7$ will behave similarly to zirconia during thermal cycling.

Example II

Lanthanum zirconate was applied to a substrate by electron beam vapor deposition (EBPVD), in a controlled atmosphere chamber. The coating was applied to a single crystal substrate (of the nominal composition of PWA 1480 (see Table II)). The coating process was carried out in a vacuum of $3.2 \times 10^{-4}$ Torr with an oxygen flow rate of 50 scam. Oxygen was added to ensure pyrochlore oxygen stoichiometry, see commonly owned U.S. Pat. No. 5,087,477. The substrate temperature was 1840° F. during deposition with a substrate to source distance of 5.25 inches. The source pyrochlore ceramic was evaporated with an electron beam run at 0.8 A and 10,000 V. The source oxide was $La_2Zr_2O_7$ powder. The coating exhibited the favorable columnar grain structure typical of electron beam physical vapor deposited cubic zirconia thermal barrier coatings that provides strain relief and improved durability over plasma sprayed coatings.

Figure 7:
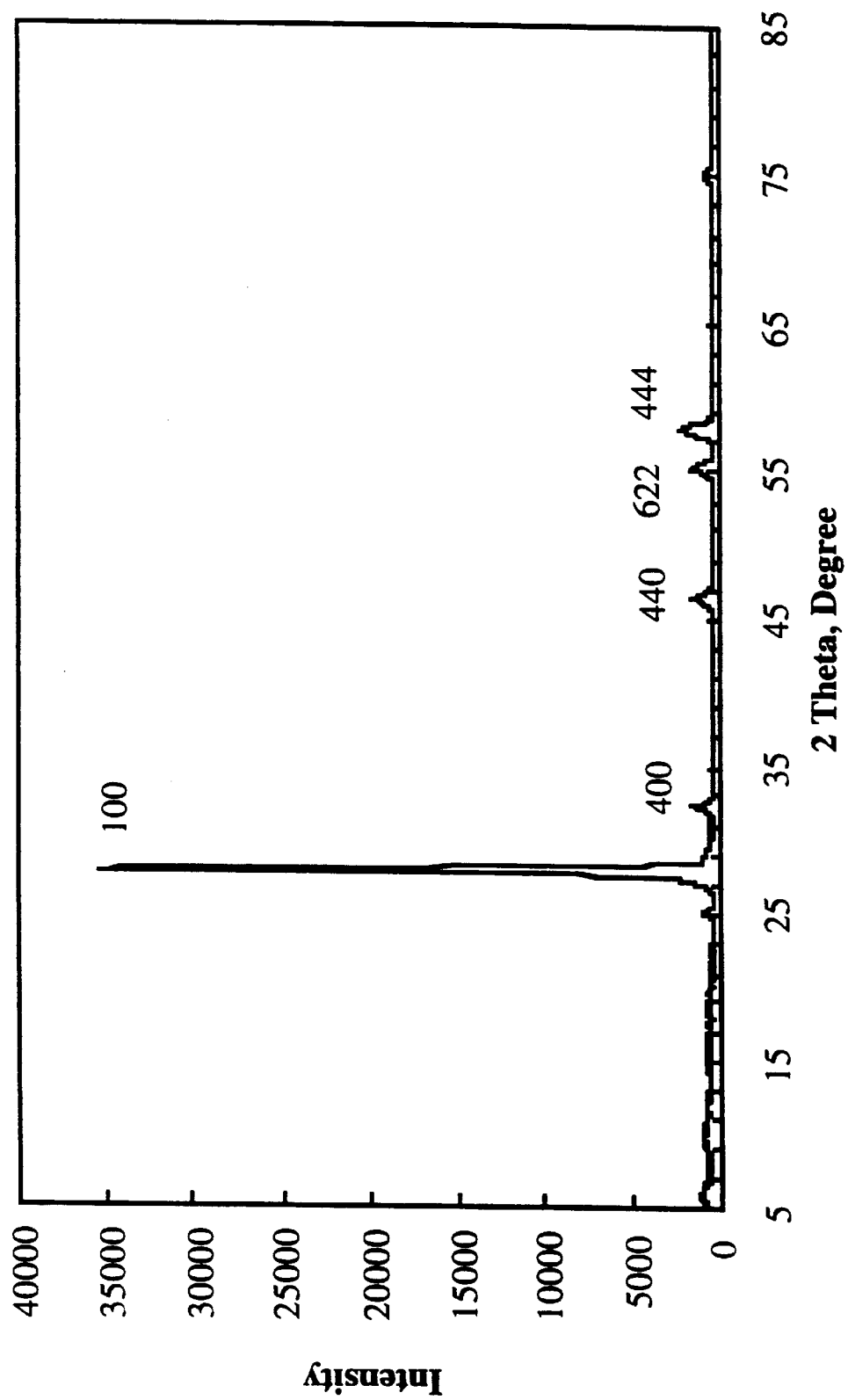
FIG. 7 shows an X-ray diffraction scan of a $ZrO_2$—$La_2O_3$ coating.

FIG. 7 shows an X-ray diffraction scan obtained from the surface of the coating. The diffraction peaks have been indexed to the pyrochlore crystal structure which demonstrates that the pyrochlore structure was formed in the deposited thermal barrier coating.

Recent testing has indicated that gadolinia-zirconate having a cubic, fluorite crystal structure $(Gd,Zr)O_2$—which may include some material (up to about 8–10 vol. %) having a pyrochlore structure also exhibits low thermal conductivity. In accordance with another aspect of the present invention, the gadolinia zirconate will preferably contain up to 100 vol. % material having a cubic crystal structure, and may includes some pyrochlore structure. Such structure is referred to herein as "fluorite" as opposed to the above-discussed "cubic pyrochlore structure" referred to as pyrochlore. The fluorite structure is essentially the structure shown in FIG. 1B. I do not rule out material having other structures.

Figure 8:
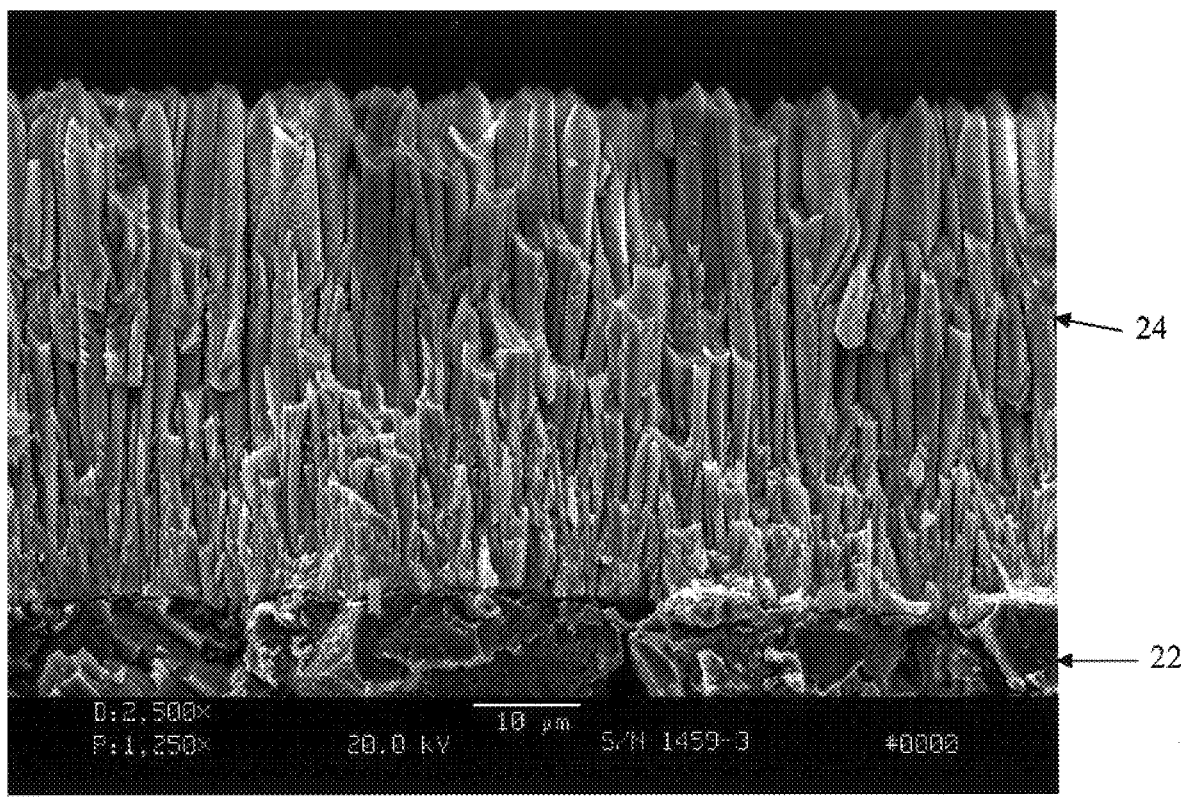
FIG. 8 shows the microstructure of gadolinia-zirconia oxide applied by EB-PVD.

FIG. 8 shows a sample of $(Gd,Zr)O_2$ applied by EB-PVD to an aluminum oxide substrate 22. The ceramic coating 24 has a columnar grain structure. The material included about 2 w/o (wt. %) yttria, as 7YSZ (rather than pure zirconia) was combined with gadolinia, and thus the use of the designation $(Gd,Y,Zr)O_2$ in FIG. 10.

Figure 9:
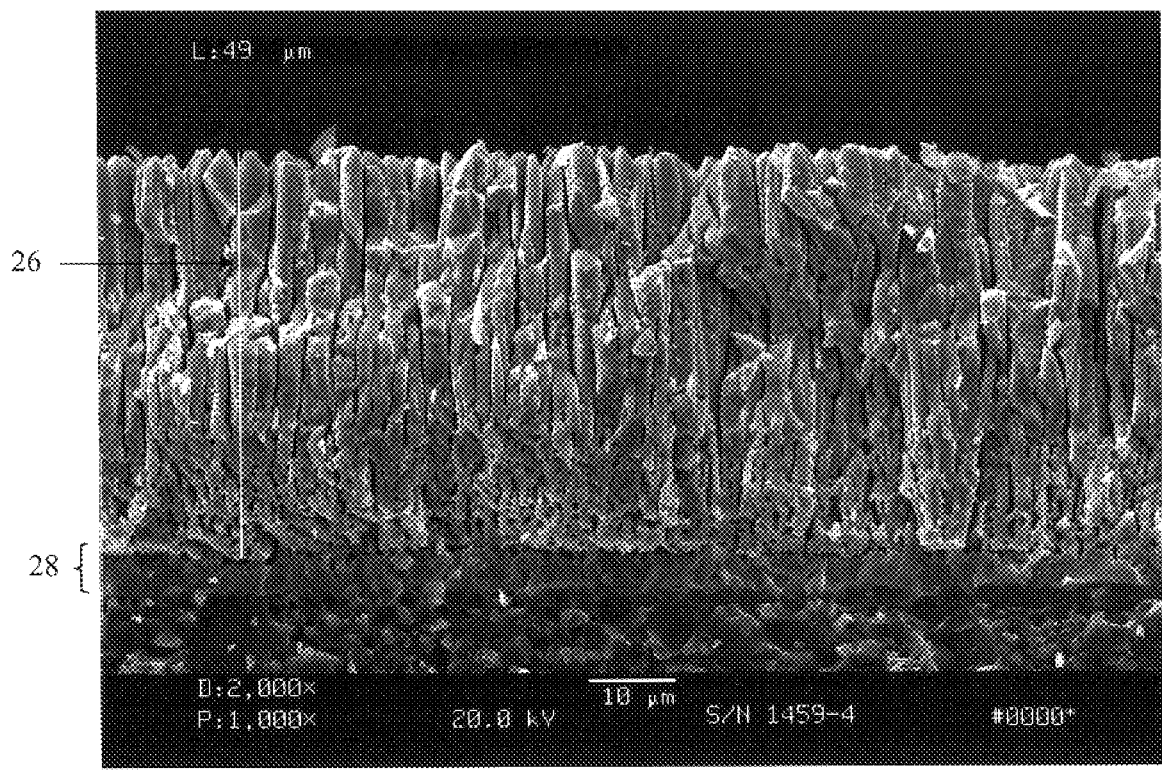
FIG. 9 shows the microstructure of gadolinia-zirconia oxide after a heat treatment.

FIG. 9 shows another sample of material, similar to the sample of FIG. 8, after being heat treated at 2500° F. for about 125 hours. The sample includes the aluminum oxide substrate and the coating, which has a thickness "L" (indicated by the white line 26 to the left of FIG. 9 as about 49 microns). The lighter band 28 located at the interface of the columnar grains and the substrate appears to be an area in which the substrate and coating materials interdiffused during the heat treatment. Erosion testing has indicated that coatings composed of fluorite gadolinia-zirconia oxide exhibits acceptable erosion resistance. Moreover, further testing has indicated that gadolinia zirconia oxide is sufficiently resistant to sintering.

Testing has also indicated that the samples include consistent compositions at various locations across the coating, and thus confirms that the gadolinia and zirconia have similar vapor pressures. Accordingly, gadolinia zirconate may be readily applied using conventional techniques, such as conventional EBPVD in which a single source target material, e.g., an alloyed ingot is evaporated, or any of the other above-noted techniques for depositing TBCs.

Figure 10:
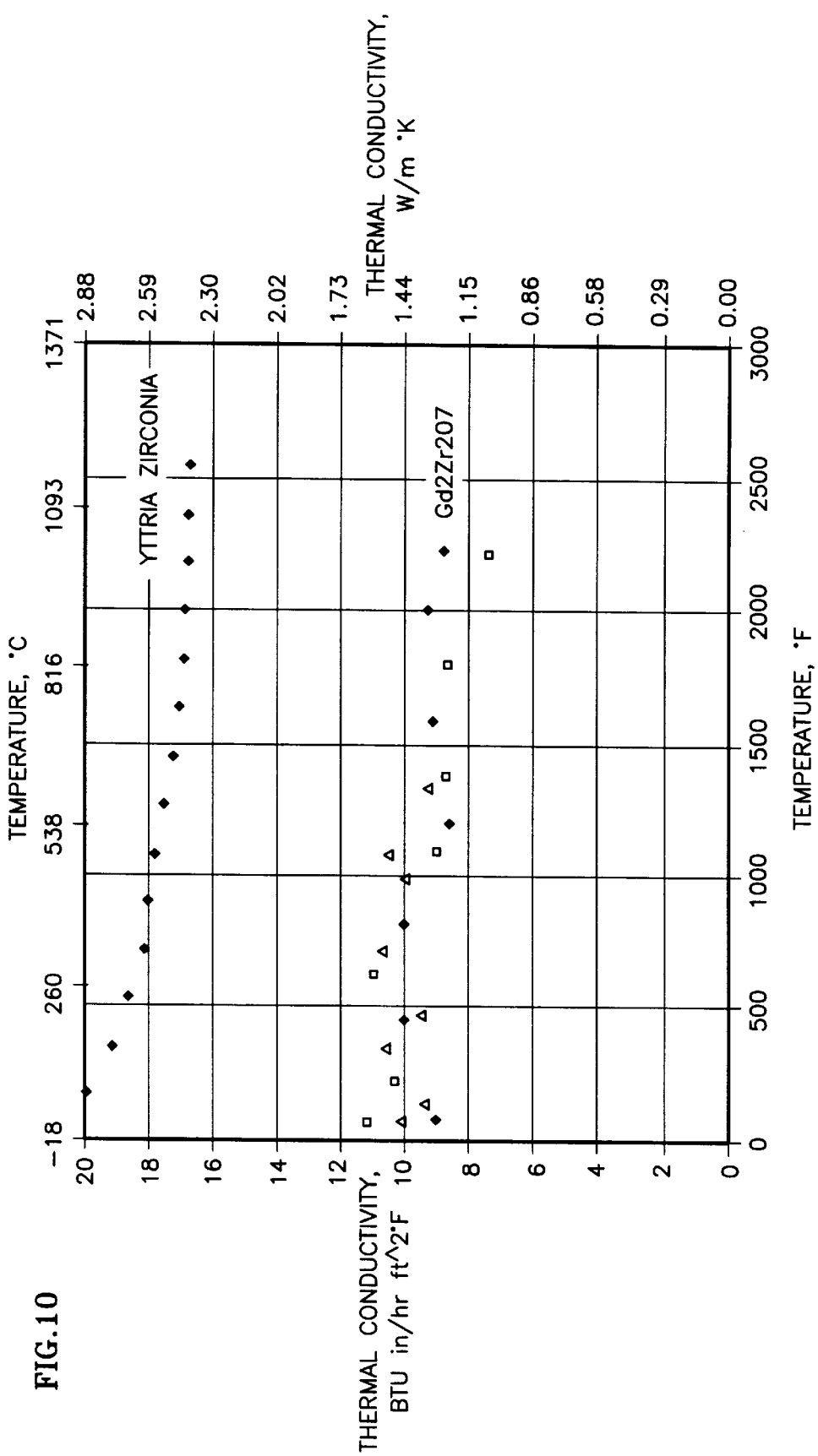
FIG. 10 shows the thermal conductivity of monolithic gadolinia-zirconia oxide samples having a cubic structure, and is compared to a sample of monolithic yttria stabilized zirconia (YSZ).

With reference to FIG. 10, several samples of monolithic, gadolinia zirconia oxide having the fluorite structure were tested, as was monolithic yttria stabilized zirconia (YSZ), between about room temperature and 2500° F. As shown, the monolithic gadolinia-zirconia has a thermal conductivity of about 1.1–1.4 W/m K, which is about one-half the measured thermal conductivity of the YSZ. The material tested included about 2 w/o (wt. %) yttria, as 7YSZ (rather than pure zirconia) was combined with gadolinia. Gadolinia zirconia oxide material consisting only of zirconia and gadolinia would be expected to exhibit a thermal conductivity similar to the samples used in FIG. 10.

Figure 11:
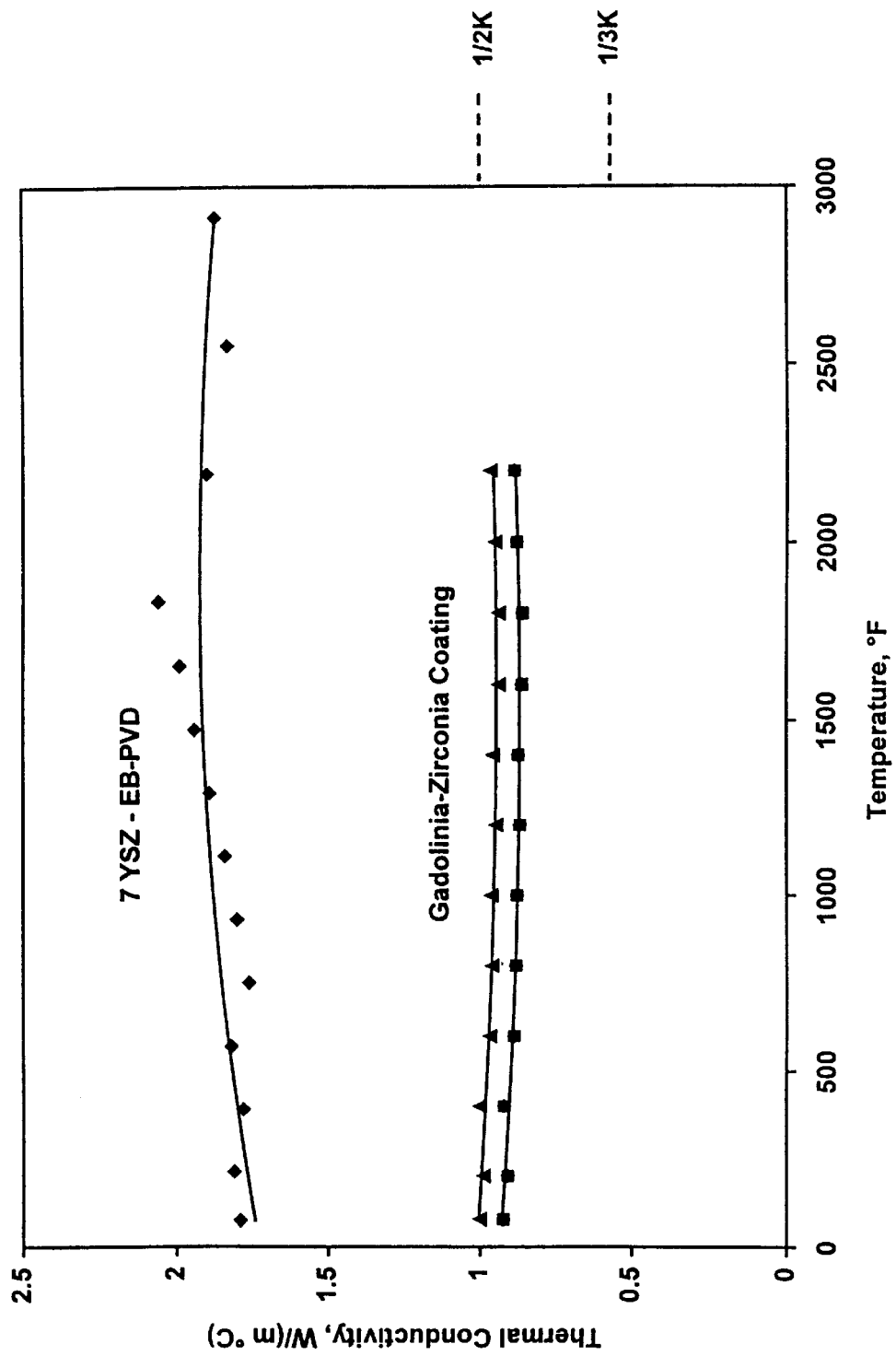
FIG. 11 shows the thermal conductivity of thin layers of gadolinia-zirconia oxide and is compared to a layer of conventional yttria stabilized zirconia (YSZ).

As indicated in FIG. 11, coatings composed of thin layers of gadolinia zirconia oxide demonstrate the same trend as bulk material with respect to YSZ, i.e., such coatings exhibit a thermal conductivity below 1.5 W/(M ° C.). More specifically, gadolinia zirconia oxide coatings have a thermal conductivity of about 1.0 W/(M ° C.) over a temperature range between about room temperature to at least about 2300° F. As indicated by the samples tested in FIG. 11, coatings comprising gadolinia zirconia oxide applied by EBPVD exhibit thermal conductivities about one half those of 7YSZ applied by EBPVD. Importantly, the reduction in thermal conductivity of gadolinia zirconia oxide relative to 7YSZ increases with increasing temperature.

The mass of gadolinia zirconia oxide is about 10% greater than compared to 7YSZ. Thus, on a density-adjusted basis, the thermal conductivity of gadolinia zirconia oxide is still roughly 50 % less than 7YSZ.

Figure 12:
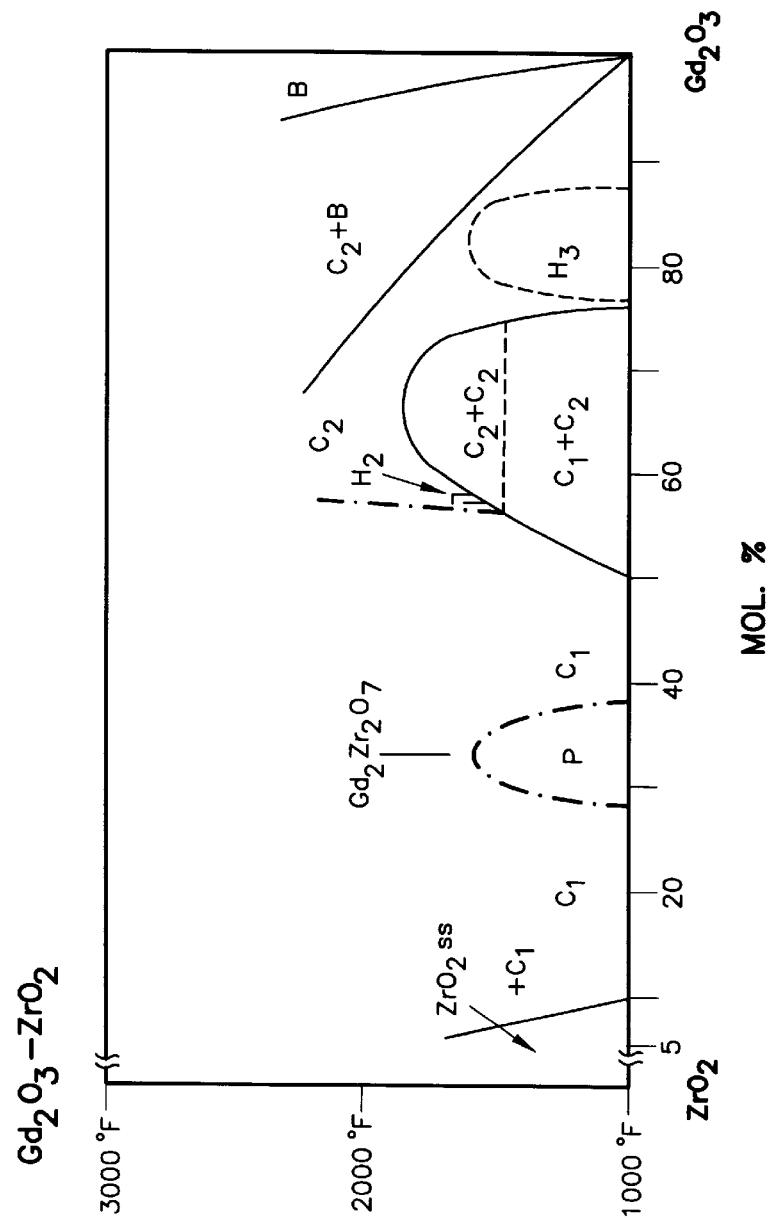
FIG. 12 is a partial phase diagram for gadolinia and zirconia.

FIG. 12 is a partial phase diagram for gadolinia and zirconia. Fluorite gadolinia zirconia oxide is phase stable to at least about 3000° F. As indicated by the non-solid lines (around the area designated "P"), gadolinia and zirconia may form a pyrochlore structure, but is not believed to be a strong pyrochlore former. Accordingly, it is believed that even in the area (P) of the phase diagram where gadolinia zirconate would be expected to be a pyrochlore former in the form of $Gd_2Zr_2O_7$ such material is likely to include at least some material having a more conventional, fluorite structure. As indicated in FIG. 12, although pyrochlore gadolinia-zirconia oxide can be formed within a broad range of compositions and is stable up to about 1800° F., any transformation should be to the fluorite structure, which as already noted is stable up to much higher temperatures. Testing of samples indicates that, for samples of gadolinia and zirconia expected to be a pyrochlore, the crystal structure of the material was primarily fluorite. This finding agrees with the indication by dashed lines of the pyrochlore area of FIG. 12

While I believe that preferred compositions of the invention include zirconia with between roughly 5–60 mol. % gadolinia, I do not rule out use of other compositions. Additionally, the zirconia or gadolinia can be partially substituted with yttria, up to about 25 mol. % and preferably only up to about 20 mol. %.

As noted above, it has been experimentally established and accepted that as the difference in atomic mass between constituents in a compound increases, the thermal conductivity of that compound tends to decrease. It would therefore be expected that gadolinia zirconia oxide has a lower thermal conductivity than YSZ, given that there is a greater difference in atomic mass between Gd (about 157) and Zr (about 91) than between Y (about 89) and Zr. However, the degree to which the reduction in thermal conductivity occurs, about 50%, is very surprising.

As also noted above, it has been generally accepted that increased complexity of the crystal structure of the material, such as the pyrochlore structure of FIG. 1A, is associated with reduced thermal conductivity. It is therefore very surprising that fluorite gadolinia zirconia oxide, given its relatively simple crystal structure—as compared to the pyrochlore $Gd_2Zr_2O_7$—exhibits a low thermal conductivity. The conductivity of gadolinia zirconia oxide is comparable to the pyrochlore $La_2Zr_2O_7$, both of which exhibit a thermal conductivity about half that of conventional YSZ. It is believed that the reduction in thermal conductivity is due to the addition of gadolinia, which provides for large difference in atomic mass (versus the zirconia) and also provides a significant number of vacancies.

The above embodiments of the present invention include the use of the coating as a single, generally homogeneous layer. However, the coating of the present invention can be employed in a system including multiple, discrete layers, such as is described in commonly owned U.S. Pat. No. 5,687,679, which is expressly incorporated herein by reference.

We have found that applying a thin layer of a ceramic such as YSZ onto the alumina layer prior to applying the TBC provides an adequate adherent layer, or ceramic bond coat, for the subsequently-applied TBC layer.

Figure 13:
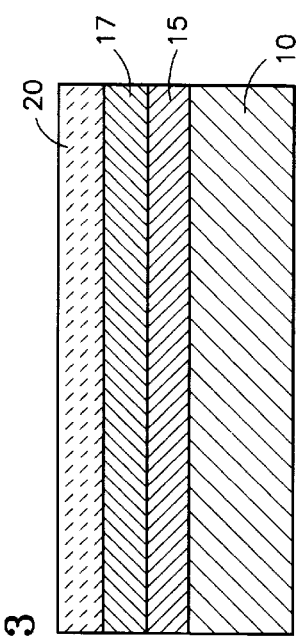
FIG. 13 is another embodiment of the present invention, including a ceramic bond coat.

In FIG. 13, the article includes a substrate 10, a metal bond coat (or at least an alumina layer) 15 and a (ceramic) thermal barrier coating 20. A ceramic bond coat layer 17 is located between the metal bond coat and the thermal barrier coating. The ceramic bond coat should be thick enough to ensure that the alumina layer is covered; however, where the ceramic bond coat is used on a rotating part such as turbine blade the layer should be no thicker than necessary to effect this purpose, as this additional layer adds weight to the pat and will contribute significantly to blade pull.

In one test, the ceramic bond coat layer was composed of 7YSZ applied by EB-PVD, and was about 0.5 mils thick, although the layer may be of a different thickness, e.g., up to several mils. It is believed that sputtering will also provide a satisfactory YSZ ceramic bond coat layer. Microscopic examination of samples including the YSZ layer has indicated that epitaxial growth occurs across grain boundaries between the YSZ and the subsequently-applied TBC layer. Moreover, the YSZ layer offers some thermal resistance in the event that the outer TBC fails.

While the present invention developed for use primarily as a thermal barrier coating, it may also be desirable to deposit the material, with a desired degree of porosity, for use as a seal. See, e.g., commonly owned U.S. Pat. 4,936,745, which is expressly incorporated by reference herein. An example would be the incorporation of polymer material into gadolinia zirconia oxide, with subsequent application by thermal spray and heat treatment to thereby generate pores in the ceramic. In such a case, the coating preferably has a porosity of between about 30–60 vol. %.

Although this invention has been shown and described with respect to detailed embodiments thereof, it will be understood by those skilled in the art that various changes, omissions and additions in form and detail thereof may be made without departing from the spirit and scope of the claimed invention.

I claim:

1. A metallic article comprising a metallic substrate having a ceramic thermal barrier coating on its surface wherein the ceramic thermal barrier coating is composed of gadolinia and zirconia and has a cubic crystal structure.

2. An article as in claim 1, wherein the metallic substrate is selected from the group consisting of steels, superalloys, titanium alloys and copper alloys.

3. An article as in claim 1, wherein the coated article is adopted to be used in environments where the free surface of the ceramic coating will be heated and the free surface of the substrate will be cooled, whereby the ceramic coating will reduce heat flow.

4. An article as in claim 1, wherein the ceramic coating has a columnar microstructure.

5. A metallic article as in claim 1, wherein the metallic article has an oxide scale on its outer surface, the oxide scale consisting essentially of alumina, and wherein the ceramic coating is bonded to the oxide scale.

6. An article as in claim 1, wherein the ceramic coating is composed of gadolinia zirconia oxide having between about 5–60 mol. % gadolinia, balance zirconia.

7. An article as in claim 1, wherein the coating has a thermal conductivity less than about 1 W/(M ° C.).

8. An article as in claim 1, wherein the coating is applied by a process selected from the group consisting of thermal spraying, sputtering and vapor deposition.

9. An article as in claim 1, wherein the coating has a porosity of between about 30–60 vol. %.

10. An article as in claim 1, further comprising:

a ceramic bond coat between the ceramic coating and the metallic substrate.

11. An article as in claim 10, wherein the ceramic bond coat is composed of yttria stabilized zirconia.

12. An article as in claim 1, wherein the article defines a gas turbine engine component.

13. A metallic article comprising a metallic substrate, the substrate having an alumina forming coating on its surface and a ceramic thermal barrier coating bonded to the alumina forming coating, wherein the ceramic thermal barrier coating is composed of gadolinia and zirconia has a cubic crystal structure.

14. An article as in claim 13, wherein the metallic substrate is selected from the group consisting of steels, superalloys, titanium alloys and copper alloys.

15. An article as in claim 13 wherein the coated article is adopted to be used in environments where the free surface of the ceramic coating will be heated and the free surface of the substrate will be cooled, whereby the ceramic coating will reduce heat flow.

16. An article as in claim 13 wherein the ceramic coating has a columnar microstructure.

17. An article as in claim 13, wherein the ceramic coating is composed of gadolinia zirconia oxide having between about 5–60 mol. % gadolinia, balance zirconia.

18. An article as in claim 13, wherein the alumina forming coating comprises an overlay coating.

19. An article as in claim 13, wherein the alumina forming coating comprises a diffusion aluminide coating.

20. An article as in claim 13, wherein the article defines a turbine engine component.

21. A metallic article comprising a metallic substrate having a ceramic coating on its surface wherein the ceramic coating consists of gadolinia and zirconia and has a cubic crystal structure.

22. An article as in claim 20, the article defines a turbine engine component.

* * * * *